Jan. 13, 1970 J. W. BALDE 3,489,656

METHOD OF PRODUCING AN INTEGRATED CIRCUIT CONTAINING MULTILAYER TANTATUM COMPOUNDS

Original Filed Nov. 9, 1964 2 Sheets-Sheet 1

INVENTOR.
JOHN W. BALDE

BY J. D. Kaufmann
ATTORNEY

United States Patent Office 3,489,656
Patented Jan. 13, 1970

3,489,656

METHOD OF PRODUCING AN INTEGRATED CIRCUIT CONTAINING MULTILAYER TANTALUM COMPOUNDS

John W. Balde, Raritan Township, Hunterdon County, N.J., assignor to Western Electric Company, Incorporated, New York, N.Y., a corporation of New York Original application Nov. 9, 1964, Ser. No. 409,656, now Patent No. 3,406,043, dated Oct. 15, 1968. Divided and this application May 31, 1968, Ser. No. 749,238
Int. Cl. C23f *17/00;* C23b *3/04, 9/00*
U.S. Cl. 204—15 6 Claims

ABSTRACT OF THE DISCLOSURE

The coated substrate of U.S. Patent 3,406,043 is utilized to fabricate a thin-film integrated circuit. The coated substrate comprises a resistive layer, a metallic oxide parting layer and a metal layer residing in that order on a non-conductive substrate. The oxide layer permits electrical conduction between the metal and resistive layers. The oxide parting layer which is unaffected by certain etchants for the other layers permits selective, sequential etching of the coated substrate to produce (a) one or more resistors from the resistive layer and (b) one or more areas of the metal layer which ultimately serve as a capacitor-electrode and as a capacitor dielectric. The areas of the metal layer are partially anodized to form a capacitor dielectric; unanodized portions of such layer serve as capacitor electrodes. The resistors are trim anodized to value. Capacitor counter-electrodes may then be deposited on the capacitor dielectric.

This is a division of application Ser. No. 409,656 filed Nov. 9, 1964 now U.S. Patent 3,406,043 issued Oct. 15, 1968 to J. W. Balde (hereafter referred to as the "Balde patent"). This invention is directed to a method of fabricating integrated thin-film R-C or R-C-L circuits, by subjecting the product (i.e. a coated substrate) claimed in the above-mentioned Balde patent to selective, sequential etching.

Tantalum nitride is desirable for resistor paths in thin-film circuits requiring high stability but is not as suitable (after anodization) for capacitor dielectrics. However, tantalum is more desirable for anodizing to form tantalum oxide capacitor dielectrics but is less suitable for resistors where high stability is required. Both tantalum nitride and tantalum are attacked by the same etchants, which is troublesome, because both the shape and the location of resistors and capacitors in the final circuits are different.

Thus, prior art methods of fabricating integrated, thin-film circuits from these or other materials attacked by the same etchant require: either (1) a repetitive sequence of film deposition on the substrate each followed by an etching process and/or (2) require that the films be deposited in specific geometric designs by the use of masks.

In the first-mentioned method the coated substrate must be removed from the vacuum each time it is to be etched and then returned to the vacuum for subsequent deposition of thin-films. Thus, it is possible to introduce contamination on the surface of the partially coated substrate each time it is removed from the vacuum for an etching operation, which contamination must be removed prior to the time the partially coated substrate is again vacuum coated. The extreme cleanliness required for the surface of the substrate can be particularly appreciated when it is understood that adsorbed layers of gases can not only alter the properties of the films by their contamination effect, but can also form thin layers of undesirable oxide which can inhibit film adhesion and produce unwanted high contact resistance.

The second prior art method also has disadvantages in part because it is difficult to handle the required masks in the vacuum environment so as to obtain precise registry of the masks when it is necessary to deposit in specific geometric designs. Other difficulties also arise with mechanical masks since they have a tendency to contaminate sputtered films, to warp under the heat of sputtering and to shed their film coating in flakes if the mask is re-used without cleaning.

This invention utilizes the novel product of the aforementioned Balde patent. In that product the layers required for the final integrated thin-film R-C or R-C-L circuits are deposited, without masking, in a one-pass continuous in-line vacuum process to minimize the possibility of contamination between depositions and also eliminate the need for masking during the deposition of these layers. By a judicious selection of materials and their sequence of deposition, the resultant coated substrate is conveniently subjected to novel selective sequential etching steps of this invention to form integrated thin-film R-C or R-C-L circuits.

The product of the aforementioned Balde patent comprises a substrate on which have been deposited in order:

(a) A resistive layer, preferably of tantalum nitride;

(b) A parting or etch-stop layer, preferably of an oxide of tantalum, such as tantalum pentoxide; and (c) A capacitor-electrode layer, preferably of tantalum.

An additional highly conductive layer may also be deposited to ultimately serve as interconnections, conductors, terminations, inductors or the like. Preferred materials are metals such as gold, copper, etc.

The method of the present invention, accordingly, may advantageously include following the above deposition steps and then applying a first resist to a portion of the highly conductive layer that represents the terminals, lands, conductors and inductors of the integrated thin-film R-C or R-C-L circuits. A first etchant is applied which will be effective in removing all of the exposed highly conductive layers, but will not attack the tantalum layer. The first resist may be removed and a second resist applied to the same areas as the first resist and also to areas which are to be the lower electrodes of capacitors. A second etchant attacks the exposed area of the tantalum. The tantalum pentoxide parting layer prevents the attack of the tantalum nitride resistor layer by the second etchant.

The second resist is removed and a third resist is then applied to the areas previously protected by the second resist and to the areas of the remaining thin coating of tantalum pentoxide and tantalum nitride which are to form the resistor paths. A third etchant is applied which will rapidly etch the exposed portions of the tantalum pentoxide and the underlying portions of the tantalum nitride layer.

The third resist can now be removed from the multilayer substrate. The tantalum nitride resistor paths can be trim anodized to value and the tantalum can be partially anodized to form a dielectric for the capacitors.

Accordingly, it is an object of this invention to provide a novel method of processing the novel product of the above-mentioned Balde patent to produce an integrated, thin-film circuit.

This and other objects of the instant invention will be better understood from the following description taken in connection with the drawings in which.

Figures 1A, 1B:
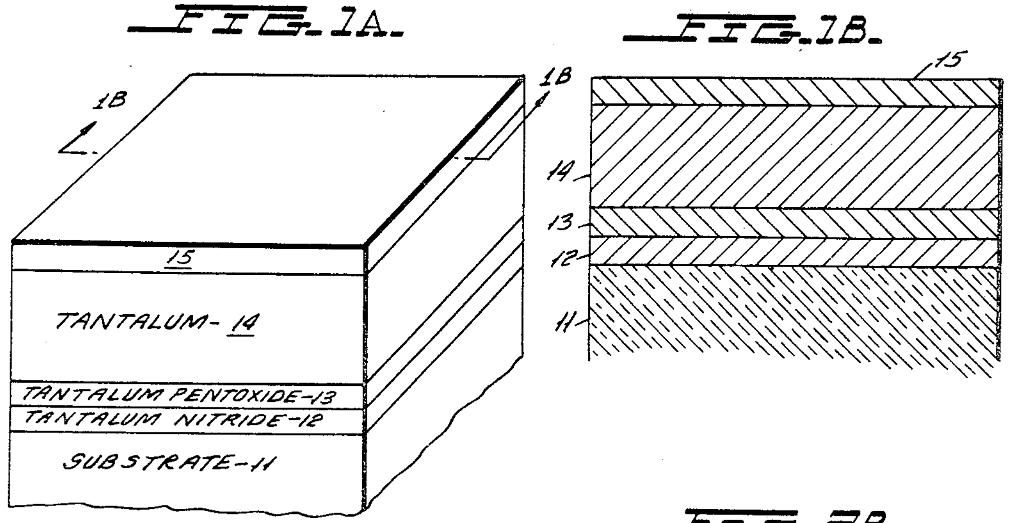
FIGURE 1A is a perspective view of the novel multilayer thin-film coated substrate of the Balde patent.
FIGURE 1B is a cross-sectional view taken in the direction of the arrow 1B—1B— of FIGURE 1A.

The substrate 11 of FIGURE 1A used in connection with the instant invention can be formed of a flat sheet of glass or it can be ceramic, glazed ceramic, inorganic crystalline material or any other material suitable for vacuum deposition operation. It is understood that the substrate 11 must be properly prepared before any layers of material are deposited thereon. Techniques and methods for proper preparation of the substrate 11 are well known in the art, as for example, as described in "The Western Electric Engineer," April 1963, page 5.

After the substrate 11 has been properly cleaned to removed all organic contamination, it can be placed in a continuous in-line vacuum processing machine of the type described in the aforementioned publication identified as "The Western Electric Engineer" on page 9–17 as well as in pending U.S. application Ser. No. 314,412 filed Oct. 7, 1963 entitled "Methods of and Operation for Processing Materials in a Controlled Atmosphere" to S. S. Charschan and H. Westgaard, and assigned to Western Electric Company, Incorporated. The various layers can then be deposited in any of the known techniques such as cathode-sputtering, vacuum evaporation, etc. It is understood that for the purposes of illustration that all vertical dimensions of the layers in the figures are greatly exaggerated.

(I) SEQUENCE OF DEPOSITING MULTILAYERS ON SUBSTRATE

At the outset, it will be noted that each of the layers 12, 13, 14 and 15 seen in FIGURES 1A and 1B are deposited over the entire top area of the substrate 11. That is, the depositions of films may be a full surface coating so that masks are not needed while the substrate 11 is in vacuum. This maskless deposition of films represents one of the advantages of this invention. It is also noted that, since all layers 12, 13, 14 and 15 may be of equal area and full surface coated by way of maskless deposition, the coated substrate can most advantageously be manufactured in the aforementioned continuous in-line vacuum processing machine, and hence it is not necessary to break vacuum between the deposition of the various layers. It will be understood that if desired the layers could be coated in other conventional ways as, for example, in batch or bell jar deposition system, or by chemical or vapor deposition.

A resistor layer 12 is initially deposited on the substrate 11. The layer 12 is a metal layer that is ultimately to serve as a resistor and is preferably tantalum nitride. The layer 12 can therefore be referred to as the resistor layer, a conductive layer, a metallic layer and/or a tantalum nitride layer. This layer 12 can be deposited by sputtering. A tantalum nitride layer 12, to be used as the resistor paths in the completed thin-film integrated R-C circuits, could be deposited to a thickness of approximately 1200 angstrom units.

Thereafter a parting layer 13 of a metal oxide is deposited over the resistor layer 12. The parting layer 13 can be tantalum pentoxide deposited by reactive sputtering. The tantalum pentoxide can be of high purity and therefore of high resistance, or the layer 13 can be a mixture of tantalum, tantalum nitride and tantalum oxide, with appreciable conductive properties. Thus the specific material for the parting layer 13 of metal oxide can be chosen at the discretion of the processor. A tantalum pentoxide parting layer 13 could be deposited by sputtering to a thickness of approximately 1000 angstrom units and prevents a second etchant from reaching the tantalum nitride resistor layer 12. However, the tantalum pentoxide film 13 is sufficiently thin to be permeated, penetrated, punctured or perforated in part by the atoms of the tantalum of the next layer, thereby subsequently permitting current to be conducted between the layers above and below, namely a tantalum capacitor-electrode layer 14 and the tantalum nitride resistor layer 12. It should be noted that the use of the metal oxide layer 13, to function as a parting layer, permits the selective sequential etching of the novel multilayer thin-film coated substrate of the Balde patent by the method of this invention.

A capacitor-electrode layer 14 of metal is then deposited over the entire area of the metal oxide parting layer 13. This can be a layer of tantalum deposited to a thickness of approximately 3500 angstrom units. The lower portion of the metal capacitor-electrode layer 14 can subsequently serve as part of the lower electrodes for the capacitors of the integrated R-C circuits and its upper surface can, when anodized, provide the dielectric for the capacitors. Alternatively to anodizing, other capacitor dielectrics can subsequently be deposited over the metal capacitor-electrode layer 14 if desired. Hence a metal layer 14 such as tantalum can be referred to as the capacitor-electrode layer or a metallic layer.

It is noted that the electrical connection between the tantalum nitride resistor layer 12 and the tantalum capacitor-electrode layer 14 is through the tantalum pentoxide parting layer 13. Tantalum pentoxide is usually used as an insulator. If the tantalum of the capacitor-electrode layer 14 is deposited by sputtering, high energy tantalum atoms will perforate the parting layer 13 so that the resistance of layer 13, perpendicular to its largest surfaces, is reduced to a negligible value of less than 1 ohm per square.

In the event it were desirable to have the tantalum capacitor-electrode layer 14 serve as the terminal areas, in situations where a direct circuit connection is made to the tantalum layer 14, then only three layers are required to form an integrated R-C circuit, from the novel coated substrate of the Balde patent: The resistor layer 12, the parting layer 13 and the capacitor-electrode layer 14. However, for interconnections, as well as for the terminal areas, it is desirable to have layers that have high conductivity, good solderability, as well as resistance to oxidation. This has usually been provided by deposits of metal such as copper, gold, palladium, etc. In the prior art, however, good adherence was also a problem since the vacuum was broken between the deposition of the various layers requiring additional deposited layers (e.g., of nickel-chromium) to improve the layer bond. However, with the present invention, the layers used for the terminal areas can be deposited in a continuous in-line process machine without breaking the vacuum after the tantalum capacitor-electrode layer 14 has been deposited. Thus, the additional deposited layer required for good adherence, such as the nickel-chromium (NiCr), can be eliminated. Thus, the layers to be deposited on top of the tantalum capacitor-electrode layer 14 need be only appropriate for terminal, inductor and interconnection areas and thus gold, copper, palladium, etc., could be used. For sake of simplicity, the deposits needed for the terminal and interconnections are indicated in the figures as a single, highly conductive layer 15, and have high conductivity, good solderability and resistance to atmospheric oxidation.

It is noted that all of the layers 12, 13, 14 and 15 described in connection with FIGURES 1A and 1B can be deposited in a continuous in-line vacuum processing machine such that following the initial cleaning of the substrate, the substrate 11 is not removed from vacuum until all the described layers have been deposited thereon. Thus, the possibility of contamination between deposition of subsequent layers is substantially reduced and permits economy of mass-production at one location. Also, all layers can be applied by maskless deposition, if so desired. It will be apparent to those skilled in the art that, if desired, the layers 12, 13, 14 and 15 can be applied to limited areas rather than full surface coating of the substrate.

The multilayer coated substrate of FIGURES 1A and 1B can be mass-produced at one location having a continuous vacuum processing machine and then shipped to a plurality of second locations having limited equipment. At the second locations the multilayer, thin-film coated substrate can be selectively sequentially etched and prepared to form integrated thin-film circuits. Thus the novel substrate with uniform areas of film material facilitates manufacture of both large and small quantities, and thus permits greater manufacturing flexibility.

(II) SELECTIVE SEQUENTIAL ETCHING OF MULTILAYER COATED SUBSTRATE

The coated substrate of FIGURES 1A and 1B initially has a first resist applied to the areas of the highly conductive layer 15 that will represent the terminal, contact, inductor, land and interconnection areas of the completed integrated circuits. Although numerous combinations of resistors, inductors and capacitors, individually or in combination, can be selectively sequentially etched with the novel coated substrate of this invention, the description and drawings illustrate the steps to be taken to manufacture a circuit of a resistor in series with a combination of a parallel resistor-capacitor. Thus in FIGURES 2A and 2B there is shown a first resist 21*a*, 21*b* and 21*c* applied for this circuit.

Although not illustrated, it will be apparent to those skilled in the art that inductors can be made in the same manner as the interconnection paths by having the first resist applied in a configuration that is to serve as the inductors.

Figure 2A:
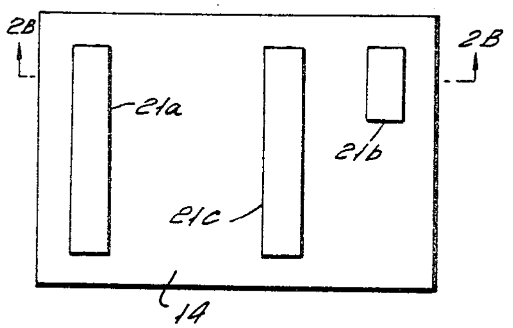
FIGURE 2A is a top view showing the first resist applied on the terminal and interconnection areas, and also shows the resultant coated substrate after the first etchant has been applied.
Figure 2B:
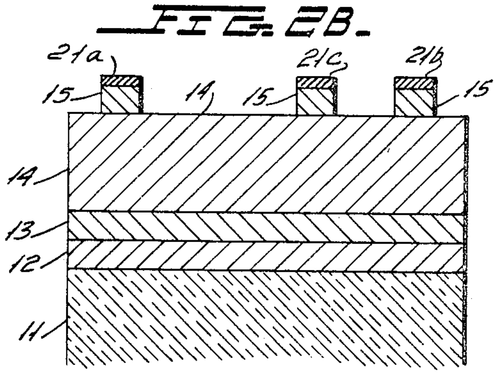
FIGURE 2B is a cross-sectional view of the coated substrate taken in the direction of the arrows 2B—2B of FIGURE 2A.

It is noted that the capacitor-electrode layer 14 made of tantalum is highly resistant to many common etchants which will attack the highly conductive layer 15. Typical first etchants could be a combination of nitric and hydrochloric acid ($HNO_3$, HCl) (aqua regia) or ferric chloride ($Fe_2Cl_3$). Thus the first etchant is selected from etchants that will remove the highly conductive layer 15 and not attack the capacitor-electrode layer 14. The resultant coated substrate after the first etchant has been applied is seen in FIGURES 2A and 2B wherein the exposed area of the highly conductive layer 15 has been removed.

Figure 3A:
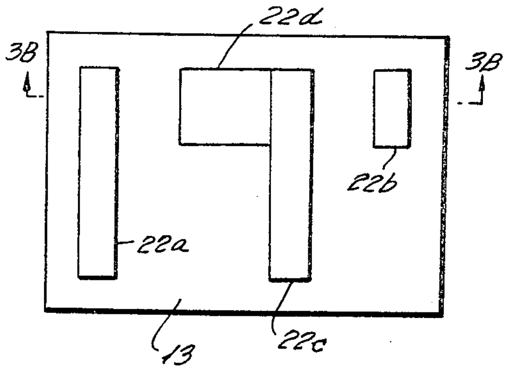
FIGURE 3A is a top view showing the second resist applied in the terminal and interconnection areas, the area to form the lower electrode of the capacitor and also showing the resultant coated substrate after the second etchant has been applied.
Figure 3B:
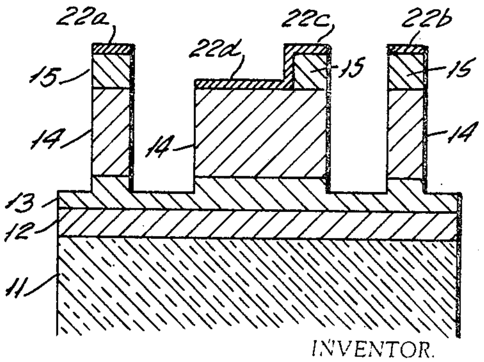
FIGURE 3B is a cross-sectional view of the coated substrate taken in the direction of the arrow 3B—3B of FIGURE 3A.

It is noted that it is difficult to have a single resist withstand several applications of different etchants. Furthermore, it is the usual practice to select the best resist for the particular etchant to be used and the resolution required. Therefore, in the description a first resist 21 is used with the first etchant and after the exposed area of the highly conductive layer 15 is removed, a first resist is removed. The second resist 22*a*, 22*b*, 22*c*, must therefore be applied, as seen in FIGURES 3A and 3B, to the same areas as were previously covered by the first resist. Also, the portions of the tantalum capacitor-electrode layer 14 which are subsequently to serve as the lower electrodes of the capacitors of the integrated R-C circuits now have the second resist applied thereto. As seen in FIGURES 3A and 3B, the area of the second resist 22*d* represents the lower electrode of the capacitor.

A second etchant is selected which will attack the tantalum capacitor-electrode layer 14 but will not attack the tantalum oxide parting layer 13. One possible second etchant could be a mixture of hydrofluoric acid, nitric acid and water ($HF—HNO_3—H_2O$) in a ratio of 1:1:2. The etch rate of tantalum in this mixture is about 200 A./sec. so that the removal of a 3500 A. film 14 could be expected to take 15–20 seconds. The etch rate of tantalum pentoxide in this mixture is about 20 A./sec. Since the tantalum pentoxide parting layer 13 is approximately 1000 A. thick, it could prevent the second etchant from reaching the tantalum nitride resistor layer 12 for 30 to 50 seconds, a time more than adequate to complete the removal of exposed area of the tantalum capacitor-electrode layer 14 by the second etchant.

It should be noted that if other thicknesses or other metals and metal oxides for capacitor-electrode layer 14 and parting layer 13 are used, other suitable second etchants can be selected by using the above noted principle. Thus, the tantalum pentoxide functions as a parting layer which enables the novel coated substrate to be selectively sequentially etched. As previously noted, the tantalum pentoxide parting layer 13 is sufficiently permeated by the tantalum sputtered on it to create a low resistance path between the tantalum capacitor-electrode layer 14 and the tantalum nitride resistor layer 12. The parting layer 13 may also comprise a mixture of tantalum, tantalum nitride and tantalum oxide. It will have appreciable inherent conduction properties even though it is not permeated during deposition by the metal of the capacitor-electrode layer 14. After the second etchant is applied, the resultant coated substrate is as seen in FIGURES 3A and 3B.

Figure 4A:
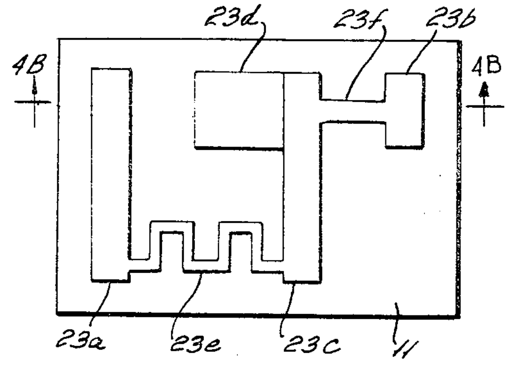
FIGURE 4A is a top view of the coated substrate showing the third resist applied in the terminal and interconnection area, lower electrode area, the areas representing the resistor paths and also showing the resultant coated substrate after the third etchant has been applied.
Figure 4B:
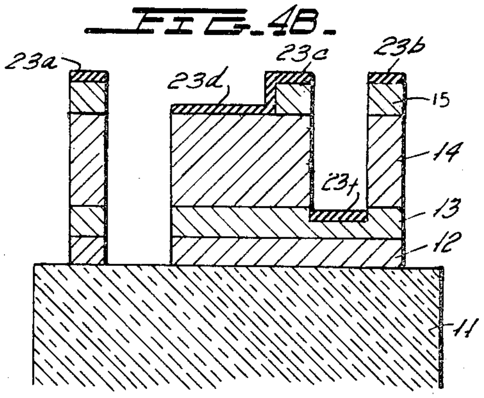
FIGURE 4B is a cross-sectional view of the coated substrate taken in the direction of the arrow 4B—4B of FIGURE 4A.

The second resist 22*a*, 22*b*, 22*c*, 22*d* is now removed and all the area previously covered by the second resist is now covered by a third resist, as for example 23*a*, 23*b*, 23*c*, 23*d* as seen in FIGURES 4A and 4B. The third resist is also applied in the areas that are to be the resistor paths, as for example 23*e* and 23*f* as seeen in FIGURES 4A and 4B.

A third etchant is selected which will not only attack the tantalum nitride resistor layer 12, but also rapidly and satisfactorily etch the remaining exposed tantalum pentoxide ($Ta_2O_5$) parting layer 13. A typical example for the third etchant is a strong base such as 10 to 12 normal hot sodium hydroxide (NaOH). Thus, the exposed tantalum pentoxide parting layer 13 can be etched rapidly by this base thereby eliminating the problem of possible resist undercutting. The resultant coated substrate, after the third etchant has been applied, is seen in FIGURES 4A and 4B.

(III) STEPS FOLLOWING SELECTIVE SEQUENTIAL ETCHING

The novel multilayer, thin-film coated substrate made as noted in Section I, is selectively sequentially etched as noted above in Section II, to create a coated substrate as seen in FIGURES 4A and 4B. The subsequent steps of anodizing, depositing upper electrodes, etc., are all well known in the prior art and will therefore only be described briefly.

Figure 5:
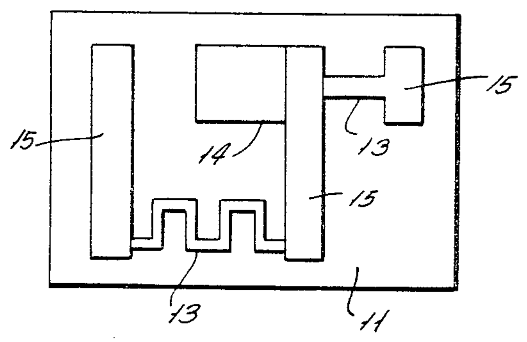
FIGURE 5 is a top view of the coated substrate of FIGURES 4A and 4B after all the resist has been removed.

The third resist 23*a*, 23*b*, 23*c*, 23*d*, 23*e* and 23*f* is now removed resulting in a coated substrate as seen in FIGURE 5.

Figure 6:
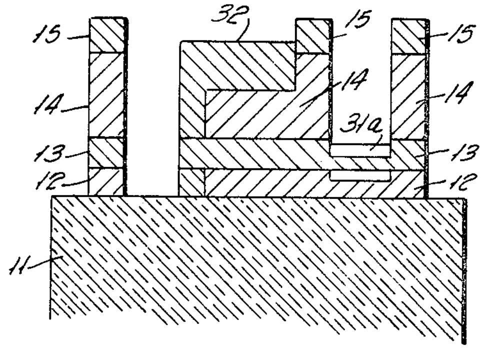
FIGURE 6 is a cross-sectional view of the coated substrate of FIGURE 5 and illustrates the portions that have been anodized.
Figure 7A:
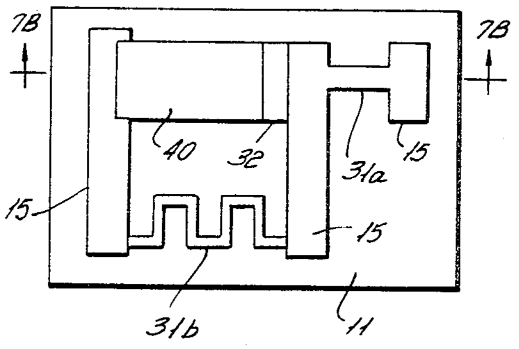
FIGURE 7A is a top view of the coated substrate of FIGURE 6, after a counter-electrode has been deposited.

The portions of the coated substrate representing the resistors, namely where the third resist 23*e* and 23*f* had been applied, can now be trim anodized to value, as seen at the numeral 31*a* and 31*b* in FIGURES 6 and 7A. Also, the portions of the coated substrate representing the lower capacitor electrode including part of the area where the third resist 23*d* had been applied, can be anodized as seen by the numeral 32 in FIGURES 6 and 7A to form a capacitor dielectric. It is noted, however, that if desired, a capacitor dielectric could be deposited directly on the capacitor-electrode area, as an alternative to anodizing, and would thus be in a similar area now indicated by the numeral 32.

Figure 7B:
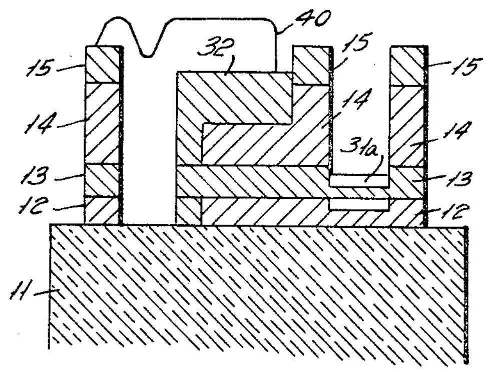
FIGURE 7B is a cross-sectional view of the coated substrate taken in the direction of the arrows 7B—7B of FIGURE 7A.

Thereafter an upper electrode and lead to one of the contact areas is deposited in a conventional manner as illustrated by the numeral 40 in FIGURES 7A and 7B. Gold is often used for the deposit 40, but other conductive materials could also be used.

The integrated thin-film R-C circuit of FIGURES 7A and 7B has left and right terminals 15 and the circuit would be as follows: From left terminal layer 15 through upper capacitor-electrode 40, down through the dielectric 32, the lower capacitor-electrode 14, 13, 12, through the resistor path of T*a*N 12 below oxide 31*a*, up through layers 12, 13, 14 to right terminal 15. A resistor under oxide 31*b* is in parallel with the capacitor and the circuit is from left terminal 15 down through layers 14, 13, 12, through the resistor path of T*a*N 12 under oxide 31*b*, up through layers 12, 13, and 14, and across the interconnection path 15 (i.e. the area previously covered by resist 21*c*, 22*c* and 23*c*) and down to the resistor path under oxide 31*a* in the manner previously described.

Accordingly, the present invention provides a novel multilayer, thin-film coated substrate that can be produced without masking, in a one-pass continuous in-line vacuum process machine and thereafter selectively sequentially etched to thereby form integrated thin-film circuits.

Although there has been described a preferred embodiment of this novel invention, many variations and modifications will now be apparent to those skilled in the art.

What is claimed is:

1. A method of fabricating an integrated, thin-film circuit from a coated substrate which comprises a resistor layer of tantalum nitride, a parting layer of tantalum pentoxide, a capacitor-electrode layer of tantalum, and a highly conductive layer, including the steps of applying a first resist to portions of said highly conductive layer which are ultimately to serve as terminal, inductor or interconnection areas of said R-C circuit to thereby permit a first etchant to attack only exposed portions of said highly conductive layer;

thereafter applying a second resist to portions of said capacitor-electrode layer which are ultimately to serve as capacitor-electrodes to thereby permit a second etchant to attack only exposed portions of said capacitor-electrode layer to form capacitor-electrodes; and thereafter applying a third resist to said parting layer in a configuration which is ultimately to be the configuration of resistor paths to thereby permit a third etchant to attack exposed portions of said parting protective layer and underlying portions of said resistor layer.

2. The method of fabricating an integrated, thin-film circuit as defined in claim 1 wherein said first, second and third resists are removed after etching, said resistor paths are anodized to value, a dielectric is formed on top of said capacitor-electrodes and counter-electrodes are deposited on said dielectric, to produce said integrated thin-film.

3. A method of fabricating an integrated, thin-film circuit from an intermediate, which intermediate includes a tantalum nitride layer, a tantalum pentoxide layer and a tantalum layer in that order on a substrate, which method comprises the steps of:

selectively etching the tantalum layer with a first etchant which does not attack the tantalum pentoxide layer, to form one or more capacitor-electrodes from the tantalum layer, and then selectively etching the tantalum pentoxide and tantalum nitride layers with a second etchant to produce one or more resistors from the tantalum nitride layer.

4. The method set forth in claim 3 wherein the tantalum pentoxide and tantalum nitride layers are selectively etched substantially simultaneously.

5. The method set forth in claim 3 wherein said first etchant is a mixture of hydrofluoric acid, nitric acid and water and said second etchant is sodium hydroxide.

6. A method of fabricating an integrated, thin-film circuit comprising the steps of:

depositing a resistor layer of tantalum nitride on an electrically non-conductive substrate;

forming a tantalum pentoxide parting layer on said resistor layer;

depositing a tantalum capacitor-electrode layer on said parting layer;

depositing a highly conductive layer on said capacitor-electrode layer;

selectively etching said highly conductive layer with a first etchant which does not attack said capacitor-electrode layer;

selectively etching said capacitor-electrode layer with a second etchant which does not attack said parting layer; and then selectively etching said parting layer and said resistor with a third etchant.

References Cited

UNITED STATES PATENTS

| | | | |
|---|---|---|---|
| 3,256,588 | 6/1966 | Sikina et al. | 156—17 |
| 3,406,043 | 10/1968 | Balde | 117—212 |

JACOB H. STEINBERG, Primary Examiner

U.S. Cl. X.R.

117—212; 156—3, 11; 204—38